(12) United States Patent
Choi et al.

(10) Patent No.: US 7,221,217 B2
(45) Date of Patent: May 22, 2007

(54) SELF-BIAS AND DIGITALLY TUNABLE CONDUCTION ANGLE CIRCUITS FOR A DIFFERENTIAL RF NON-LINEAR POWER AMPLIFIER EMPLOYING LOW-VOLTAGE TRANSISTORS

(75) Inventors: Kiyong Choi, Seattle, WA (US); David J. Allstot, Seattle, WA (US)

(73) Assignee: University of Washington, Seattle, WA (US)

( * ) Notice: Subject to any disclaimer, the term of this patent is extended or adjusted under 35 U.S.C. 154(b) by 11 days.

(21) Appl. No.: 10/600,043

(22) Filed: Jun. 19, 2003

(65) Prior Publication Data

US 2004/0217813 A1   Nov. 4, 2004

Related U.S. Application Data

(60) Provisional application No. 60/420,431, filed on Oct. 21, 2002.

(51) Int. Cl.
 *H03F 1/24* (2006.01)
 *H03F 1/36* (2006.01)

(52) U.S. Cl. ............... 330/98; 330/277; 330/310; 330/311; 330/259; 330/261; 330/254; 330/278; 330/253; 330/285; 330/296

(58) Field of Classification Search ............... 330/277, 330/98, 310, 311, 259, 261, 254, 278, 253, 330/285, 296
See application file for complete search history.

(56) References Cited

U.S. PATENT DOCUMENTS 4,591,774 A * 5/1986 Ferris et al. ............... 318/696

5,426,641 A * 6/1995 Afrashteh et al. ........... 370/347
6,542,037 B2 * 4/2003 Noll et al. .................. 330/301

FOREIGN PATENT DOCUMENTS

JP   3622877704   * 12/1987

OTHER PUBLICATIONS

Millman "Microelectronics Digital and Analog Circuits and Systems" McGraw-Hill Book Company Copyright 1979 p. 254.*
T. Sowlati and D. Leenaerts, "A 2.4 GHz 0.18 um CMOS Self-Biased Cascode Power Amplifier with 23dBm Output Power," *IEEE International Solid-State Circuits Conference 2002 Technical Digest*, Feb. 2002, pp. 285,294,295,467.

* cited by examiner

*Primary Examiner*—Michael B Shingleton
(74) *Attorney, Agent, or Firm*—Blakely Sokoloff Taylor & Zafman LLP

(57) ABSTRACT

A differential RF non-linear power amplifier employing low-voltage transistors in a cascode configuration uses self-biasing solutions rather than external biasing techniques to overcome transistor breakdown problems. The self-biasing solution ensures that the cascode devices and driver device operate below breakdown voltage limitations. A low resistance circuit is placed in parallel with the self-biased circuitry to mitigate increased on-resistance created by the self-biasing solution. PMOS and NMOS inverter legs provide digital programming of the conduction angle for the power amplifier. Changing the PMOS and NMOS strengths in the chain of inverter legs changes the conduction angle.

11 Claims, 3 Drawing Sheets

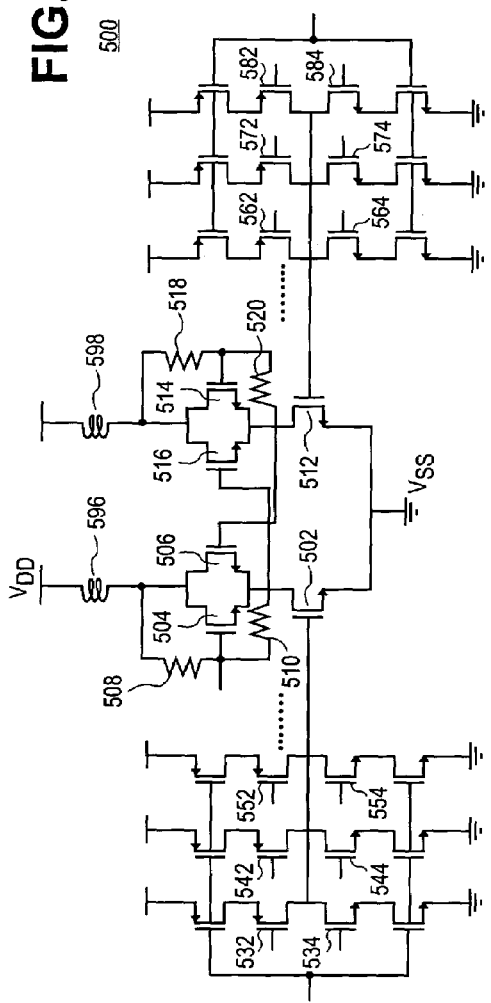
FIG. 5
500
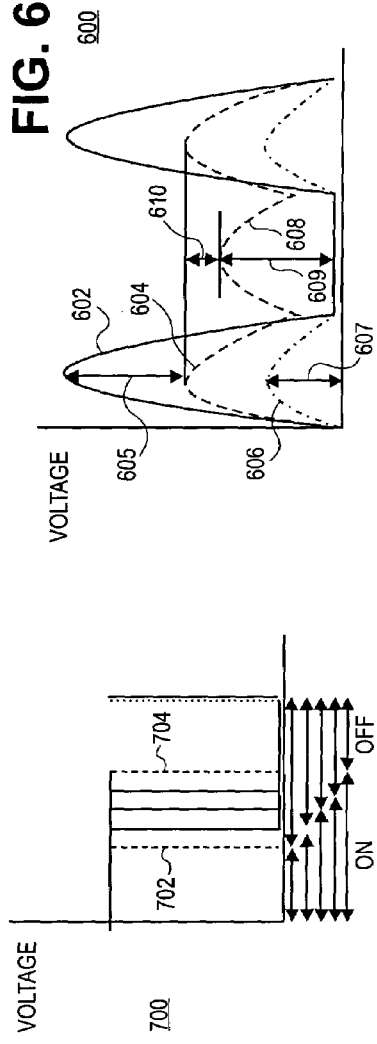
FIG. 6
600
FIG. 7
700

SELF-BIAS AND DIGITALLY TUNABLE CONDUCTION ANGLE CIRCUITS FOR A DIFFERENTIAL RF NON-LINEAR POWER AMPLIFIER EMPLOYING LOW-VOLTAGE TRANSISTORS

RELATED APPLICATION

This application claims priority to U.S. provisional application Ser. No. 60/420,431, filed Oct. 21, 2002, entitled "Self-Bias And Digitally-Tunable Conduction Angle Circuits For A Differential RF Non-Linear Power Amplifier Employing Low-Voltage Transistors."

BACKGROUND

1. Field

The present invention relates to radio frequency (RF) power amplifiers and more particularly to a RF power amplifiers employing low voltage transistors.

2. Background

Many single chips, sometimes called system-on-chip (SOC) solutions, are used in wireless communication devices such as cell phones, pagers, cable television boxes, remote controllers, personal digital assistants (PDAs), and other wireless devices. Such devices need to transmit signals across several feet or even yards. High efficiency radio frequency (RF) power amplifiers are used to amplify signals so they may be transmitted such distances. The more power the power amplifiers can deliver to the antenna, the further the device can transmit. Unfortunately, development of high-efficiency RF power amplifiers suitable for wireless SOC solutions remains a major unsolved challenge because the transistors in the power amplifiers breakdown due to the high voltages to which they are subject.

The voltage at which a transistor breaks down is a function of the size of the transistor. The smaller the transistor, the lower the voltage it can tolerate before permanent damage occurs. This is problematic because transistors are getting smaller so that more transistors may fit in smaller spaces as devices get smaller.

To illustrate, FIG. 1 shows a prior art solution for preventing transistor breakdown. FIG. 1 shows a cascode structure 100 in a high-efficiency RF power amplifier 100 with fixed bias. The cascode structure 100 includes cascode device 102, driver devices 104 and 106, an inductor 108, and a capacitor 110. FIG. 2 is a graphical representation 200 including a typical input waveform 204 for the cascode structure 100 and includes a "y" axis representing voltage and an "x" axis representing time. FIG. 3 is a graphical representation 300 including a typical output waveform 302 for the cascode structure 100 when the waveform 204 is applied. The graphical representation includes an "y" axis representing voltage and a "x" axis representing time.

A waveform 302 illustrates that when the waveform 204 is applied to the cascode structure 100 at a time $t_m$ the voltage across the gate-drain junctions of the transistor 102 ($V_{G-D}$) may be more than twice as large as the power supply voltage $V_{DD}$. Such high voltage may cause the gate-drain junction of the transistors 102 to break down.

There is another challenge to developing the cascode structure 100 for SOC involving the fact that the transistors 102 and 104 are connected in series. Ideally the transistors 102 and 104 should be switches such that when they are on, they are short circuits and when they are off they are open circuits. Unfortunately, in real circuits, when a transistor is on it has a resistance associated with it that consumes power otherwise intended for the antenna and output power of the device.

There is still another challenge facing development of high-efficiency RF power amplifiers for wireless SOC solutions involving the amplifier class. Amplifier operation can be classified generally as "linear" or "nonlinear." Classes A, B, and AB, are commonly considered linear classes of RF power amplifiers and classes C, E, and F are commonly considered nonlinear classes. To change the class of operation, the conduction angle of the linear power amplifier is changed. The conduction angle is the portion of time that the power amplifier (or device) is on (or conducting) expressed in degrees. Traditional techniques for changing the conduction angle involve operators manually adjusting analog voltage levels and other parameters.

As applied to FIG. 1, the operator would adjust the value the bias voltage applied to a matching network formed by the inductor 108 and the capacitor 110 via a $V_{BIAS}$ pin. The waveforms 202 and 204 illustrate the effect of adjusting the value bias voltage. For instance, the waveform 202 is input into the cascode structure 100 and the waveform 204 is input into the cascode structure 100 when the bias voltage is $V_{LC}$. Notice that when the bias voltage is $V_{LC}$ the transistor 104 is on some of the time and off some of the time depending on when the voltage level of the waveform 204 crosses the threshold voltage $V_T$ of the transistor 104.

There are at least two dilemmas in this arrangement. First, the cascode structure 100 requires the extra (possibly external) $V_{BIAS}$ pin to vary the conduction angle. Second, the size of the blocking capacitor 110 needed to accommodate the width of the transistor 104 is commonly very large, which is counterproductive to integration of RF power amplifiers in small SOC solutions.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 5 is a schematic diagram of a self-biased cascode power amplifier according to an embodiment of the present invention;

FIG. 6 is a graphical representation of an output waveform for the amplifier illustrated in FIG. 4 according to an embodiment of the present invention; and FIG. 7 is a graphical representation of a possible set of square waves, one of which is input to an RF power amplifier from a digital conduction angle circuit according to an embodiment of the present invention.

DETAILED DESCRIPTION OF THE ILLUSTRATED EMBODIMENTS

Embodiments of the present invention are directed to a differential RF non-linear power amplifier employing low-voltage transistors in a cascode configuration. The power amplifier uses self-biasing solutions rather than external fixed biasing techniques to overcome transistor breakdown problems. The self-biasing solution ensures that the cascode devices and driver device operate below breakdown voltage limitations. A low resistance circuit is placed in parallel with the self-biased circuitry to mitigate increased on-resistance created by the self-biasing solution. p-channel metal-oxide-semiconductor (PMOS) and n-channel metal-oxide-semiconductor (NMOS) inverter devices provide digital programming of the conduction angle for the power amplifier. Changing the PMOS and NMOS strengths in the chain of inverters changes the conduction angle of the power amplifier.

Figure 1:
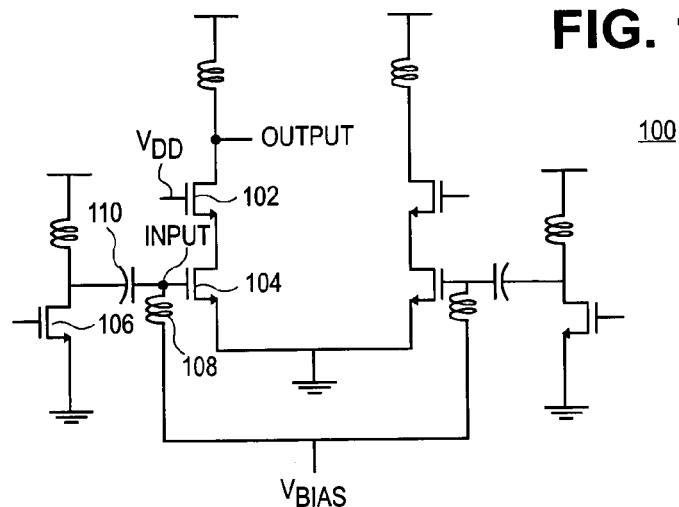
FIG. 1 is a schematic diagram of a prior art power amplifier with fixed bias.
Figure 2:
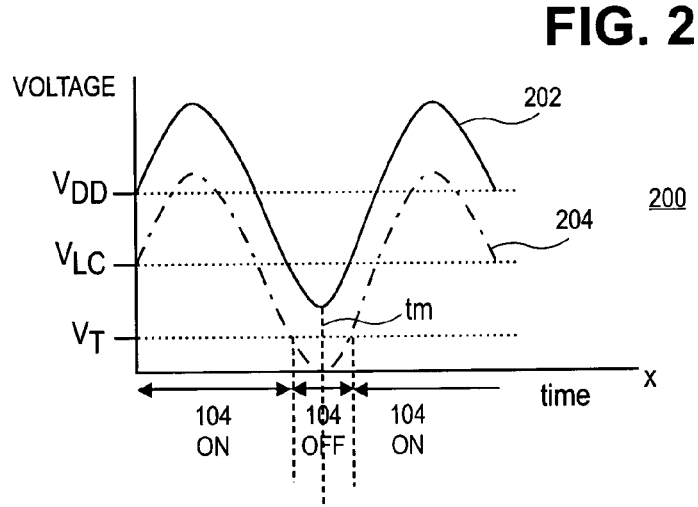
FIG. 2 is a graphical representation of an input waveform for an amplifier illustrated in FIG. 1.
Figure 3:
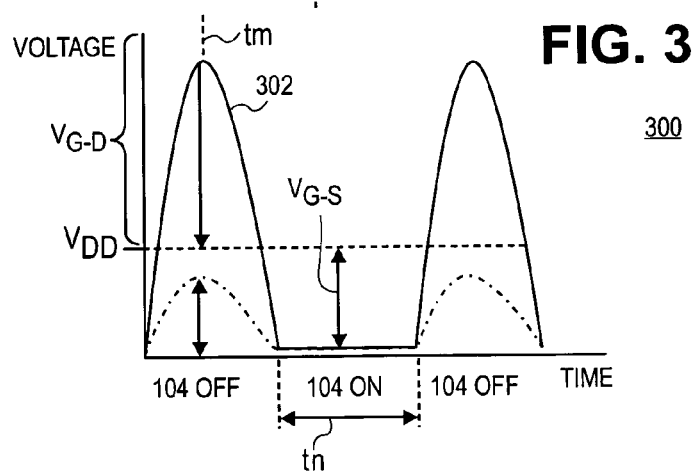
FIG. 3 is a representation of an output waveform for the amplifier illustrated in FIG. 1.
Figure 4:
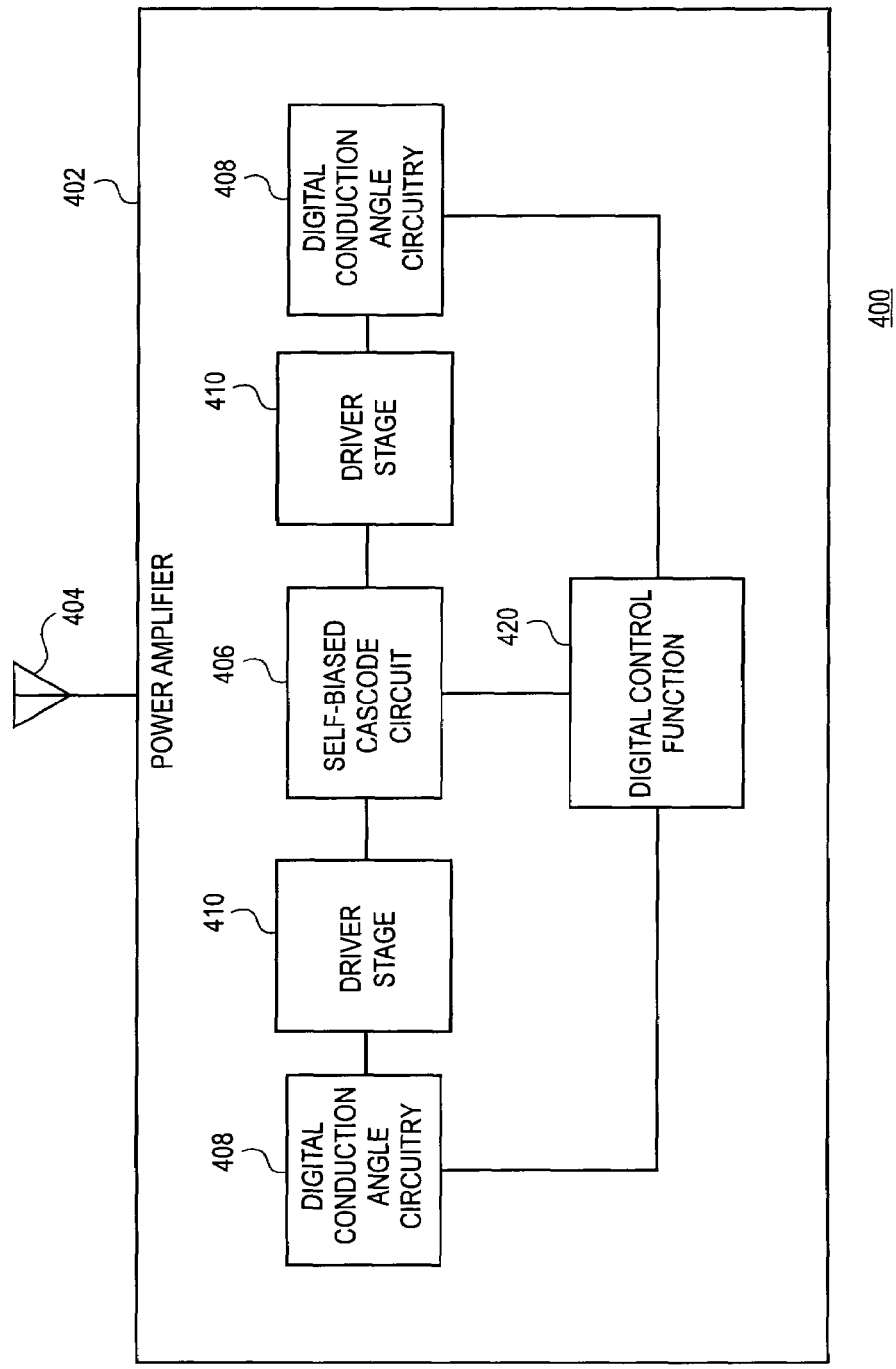
FIG. 4 is a high-level block diagram of a system according to an embodiment of the present invention.

FIG. 4 is a high-level block diagram of a system 400 according to embodiments of the present invention. The example system 400 includes a power amplifier 402 coupled to an antenna 404. The example system also may include digital conduction angle circuitry 408 merged with driver stages 410 of the power amplifier 402. The power amplifier 402 includes self-biased cascode circuitry 406. The example system 400 also includes a digital control function 420 coupled to the digital conduction angle circuitry 408. Although illustrated as discrete components any one, some, or all of the components of the system 400 may be discrete, integrated in a single a system-on-chip (SOC) device, or a combination thereof.

The power amplifier 402 may be a linear, nonlinear, single-ended, and/or differential power amplifier.

The antenna 404 may be any antenna suitable for implementation in wireless communication devices driven by single-ended or differential RF power amplifiers. Suitable antennas are well known.

The cascode circuitry 406 may include transistors that have voltage limitations to reduce the risk that the transistors break down.

The digital conduction angle circuitry 408 may be used to program the power amplifier 402 to operate at various conduction angles when an analog signal is applied to the digital conduction angle circuitry 408.

The driver stages 410 may drive the cascode circuitry 406.

FIG. 5 is a schematic diagram of cascode circuitry 500 according to an embodiment of the present invention. The circuitry 500 includes transistors 502, 504, and 506, and resistors 508 and 510. The drain of the transistor 502 is coupled to the sources of the transistors 504 and 506. The source of the transistor 502 is coupled to $V_{SS}$. The drain of the transistor 504 is coupled to the gate of the transistor 504 via the resistor 508. The gate of the transistor 504 is coupled to the gate of the transistor 516 via the resistor 510. The drains of the transistors 504 and 506 are coupled to an inductor 596, which is coupled to $V_{DD}$.

In the illustrated embodiment, the transistor 502 forms a driver stage. The transistors 504 and 506 are cascode devices. The resistors 508 and 510 provide self-biasing for the transistor 504 to reduce the risk that breakdown voltage limitations are exceeded. By selecting the ratio of the resistor 508 to the resistor 510, the bias voltage can be adjusted according to the particular limitations of the circuit.

With such an arrangement when the waveform 204 or other suitable analog waveform is applied to the gate of the transistor 502, the gate-drain of the transistor 504 are protected from breaking down when the transistor 502 is off because the voltage on the gate of the transistor 504 follows the voltage on the drain of the transistor 504.

There is a tradeoff, however, because such an arrangement creates quite an on-resistance problem in the signal path that goes through the transistors 502 and 504. In one embodiment of the present invention, the circuitry 500 also includes a lower resistance signal path 506 in parallel with the higher resistance signal path through the transistors 502 and 504.

For example, the circuitry 500 includes the transistors 512, 514, and 516, and resistors 518 and 520. The drain of the transistor 512 is coupled to the sources of the transistors 514 and 516. The source of the transistor 512 is coupled to $V_{SS}$. The drain of the transistor 514 is coupled to the gate of the transistor 514 via the resistor 518. The gate of the transistor 514 is coupled to the gate of the transistor 506 via the resistor 520. The resistor 520 is coupled to the gate of the transistor 506 and the resistor 510 is coupled to the gate of the transistor 516.

This arrangement creates a lower resistance signal path through the transistor 506. This is characterized as a low resistance signal path because as the voltage in one signal path is going up the voltage in the other signal path is going down. When the transistor 502 is on, the overall on-resistance in the signal path that goes through the transistors 502, 504, and 504 is small because of the cross-coupled configuration of the transistor 506. Such a configuration biases the gate of the transistor 514 high. Thus, when the transistor 502 is on, the gate of the transistor 506 also is biased high. When the overall resistance is reduced, the circuit is more efficient.

Note that the resistors 508, 510, 518, and 520 provide a self-biasing feature for the circuit 500. As such, any power amplifier embodying the circuit 500 may not need a separate biasing pin.

FIG. 6 is a graphical representation 600 including a typical output waveform 602 for the cascode structure 100 when the waveform 204 is applied. The graphical representation includes an "y" axis representing voltage and a "x" axis representing time.

A waveform 602 represents the voltage on the drain of the transistor 504 when the transistor 502 is off. An arrow 605 illustrates that the voltage swing in the circuit 500 is approximately $V_{DD}$ as opposed to more than twice $V_{DD}$ in the prior art.

A waveform 604 represents the voltages on the gate of the transistor 504 when the transistor 502 is off. The resistor 510 provides the waveform 604. The arrow 605 represents the maximum gate-drain voltage for the transistor 504 when the transistor 502 is off. A waveform 606 represents the voltage on the drain of the transistor 502 when the transistor 502 is off. An arrow 607 represents the maximum gate-drain voltage for the transistor 502 when the transistor 502 is off.

A waveform 608 represents the voltage on the gate of the transistors 504 when the transistor 502 is on. An arrow 609 represents the maximum gate-source voltage for the transistors 506 when the transistor 502 is on.

By adjusting the ratio of the resistors 508 and 510, an area 601 increases or decreases, which illustrates that voltage on the gates of the transistors 504 and 506 can be adjusted such that the transistors 502, 504, and 506 all operate below the breakdown voltage limitations while power efficiency is simultaneously improved.

A feature of the example circuit 500 allows a conduction angle of a power amplifier to be digitally programmed, which is counterintuitive to analog power amplifier design principles. This is because in general it is counterintuitive to combine digital programming with a power amplifier.

In the example embodiment shown, the circuit 500 includes the transistors 532, 534, 542, 544, 552, 554, 562, 564, 572, 574, 582, and 584. The transistors 532 and 534 form parts of branches of PMOS and NMOS switches, as do the transistors 542 and 544, the transistors 552 and 554, the transistors 562 and 564, the transistors 572 and 574, and the transistors 582 and 584. The programmable branches in combination form inverters, which are coupled to the gate of the transistors 502 and 512.

The inverters output a square wave onto the gate of the transistors 502 and/or 512. The duty cycle of the square wave may be controlled by the ratio (or combination) of PMOS to NMOS switches. Turning some of the PMOS and/or NMOS switches on and/or turning some of the PMOS and/or NMOS switches off changes the ratio of PMOS to NMOS switches. By changing the ratio of PMOS to NMOS switches, the average or DC bias voltage on the gate of the transistors 502 and/or 512 is changed. In one embodiment, the greater the number of PMOS switches to the number of NMOS switches, the greater the conduction angle of the transistor 502 or 512. In one embodiment of the present invention, the switches 532, 542, and 552 are PMOS switches and the switches 534, 544, and 554 are NMOS switches.

FIG. 7 is a graphical representation 700 of a possible set of square waves applied to the gate of the transistor 502 according to an embodiment of the present invention. The graphical representation 700 includes an "y" axis representing voltage and a "x" axis representing time. A waveform 702 illustrates an embodiment in which the NMOS switches 534, 544, and 554 are on, PMOS switch 532 is on, and PMOS switches 542 and 552 are off. A waveform 704 illustrates an embodiment in which the switches 532, 542, 552, 534, 544, and 554 are on while 544 and 554 are off.

An advantage of digitally controlling the conduction angle of a power amplifier according to embodiments of the present invention is that the area consuming blocking capacitor 110 and inductor 108 network in the prior art are eliminated. This may result in reduced total chip costs.

In the description herein, numerous specific details, such as particular processes, materials, devices, and so forth, have been presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Some parts of this description have been presented using terms such as amplifier, resistor, MOS, waveform, and so forth. These terms are commonly employed by those skilled in the art to convey the substance of their work to others skilled in the art.

Various operations have been described as multiple discrete blocks performed in turn in a manner that is most helpful in understanding embodiments of the invention. However, the order in which they have been described should not be construed to imply that these operations are necessarily order dependent or that the operations be performed in the order in which the operations are presented.

Reference throughout this specification to "one embodiment" or "an embodiment" means that a particular feature, structure, process, operation, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

While specific examples and/or embodiments of the invention are described herein for illustrative purposes, various equivalent modifications are possible, as those skilled in the relevant art will recognize. These modifications can be made in light of the above detailed description.

Embodiments of the invention can be implemented using hardware, software, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit embodiments of the invention to the precise forms disclosed. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A radio frequency (RF) power amplifier, comprising:
a first, a second, a third, a fourth, a fifth, and a sixth transistor, each having a drain, a source, and a gate; and
a first, a second, a third, and a fourth resistor;
the drain of the first transistor directly connected to the sources of the second and third transistors and, the drain of the second transistor directly connected to the gate of the second transistor via the first resistor, the gate of the second transistor directly connected to the gate of the sixth transistor via the second resistor,
the drain of the fourth transistor directly connected to the sources of the fifth and sixth transistors and, the drain of the fifth transistor directly connected to the gate of the fifth transistor via the third resistor, the gate of the fifth transistor directly connected to the gate of the third transistor via the fourth resistor, the fourth resistor directly connected to the gate of the third transistor and the second resistor directly connected to the gate of the sixth transistor.

2. A system, comprising:
a radio frequency (RF) power amplifier; and
circuitry merged with the RF power amplifier to apply a digital signal to the RF power amplifier, the digital signal to program a conduction angle of the RF power amplifier;
wherein the circuitry comprises multiple inverter branches of p-type metal oxide semiconductor (PMOS) and n-type MOS (NMOS) switches coupled to the RF power amplifier, wherein strengths of the multiple inverter branches are changed to program the conduction angle of the RF power amplifier, wherein the multiple inverter branches comprise at least a first a first, a second, a third, a fourth, a fifth, and a sixth transistor, each having a drain, a source, and a gate, wherein the gates of the first, second, third, fourth, fifth, and sixth transistors are coupled to receive a signal to turn on and/or turn off the respective transistors, wherein the sources of the first, third, and fifth transistors are coupled to the drains of the second, fourth, and sixth transistors, and to the RF power amplifier.

3. The system of claim 2, wherein the PMOS and NMOS inverter branches include a logical "1" state or a logical "0" state.

4. The system of claim 2, wherein the RF power amplifier includes a self-biased differential cross-coupled cascode stage.

5. The system of claim 4, wherein the RF power amplifier includes a driver stage.

6. The system of claim 2, further comprising a digital control function coupled to the RF power amplifier.

7. The system of claim 2, further comprising a digital control function coupled to the digital conduction angle tuning circuitry.

8. A radio frequency (RF) power amplifier, comprising:
   a driver stage; and
   a self-biased cascode stage coupled to the driver stage, the self-biased cascode stage including a first transistor, a second transistor, a third transistor, a fourth transistor, a fifth transistor, and a sixth transistor, each having a drain, a source, and a gate, the drain of the first transistor directly connected to the sources of the second and third transistors, the gate of the first transistor directly connected to the driver stage, the drain of the second transistor directly connected to the gate of the second transistor via the first resistor, and the gate of the second transistor directly connected to the gate of the fifth transistor via the second resistor.

9. The RF power amplifier of claim 8, further comprising a second driver stage coupled to the self-biased cascode stage.

10. The RF power amplifier of claim 8, wherein the driver stage is an inverter-type class B amplifier.

11. A method of operating a radio frequency (RF) power amplifier, comprising:
   applying a digital signal to a radio frequency (RF) power amplifier;
   programming a conduction angle of the RF power amplifier using the digital signal by adjusting strengths of multiple inverter branches of p-type metal oxide semiconductor (PMOS) and n-type MOS (NMOS) switches, wherein the multiple inverter branches comprise at least a first a first, a second, a third, a fourth, a fifth, and a sixth transistor, each having a drain, a source, and a gate, wherein the gates of the first, second, third, fourth, fifth, and sixth transistors are coupled to receive a signal to turn on and/or turn off the respective transistors, wherein the sources of the first, third, and fifth transistors are coupled to the drains of the second, fourth, and sixth transistors, and to the RF power amplifier;
   applying an analog information signal to the RF power amplifier; and
   operating the RF power amplifier at the conduction angle specified by the digital signal.

\* \* \* \* \*